United States Patent
Oszinda et al.

(10) Patent No.: US 11,011,504 B2
(45) Date of Patent: May 18, 2021

(54) OPTOELECTRONIC SEMICONDUCTOR CHIP AND METHOD OF PRODUCING AN OPTOELECTRONIC SEMICONDUCTOR CHIP

(71) Applicant: OSRAM Opto Semiconductors GmbH, Regensburg (DE)

(72) Inventors: Thomas Oszinda, Penang (MY); Ban Loong Chris Ng, Penang (MY)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/253,921

(22) Filed: Jan. 22, 2019

(65) Prior Publication Data

US 2019/0229102 A1    Jul. 25, 2019

(30) Foreign Application Priority Data

Jan. 23, 2018  (DE) .................... 10 2018 101 393.0

(51) Int. Cl.
| | |
|---|---|
| *H01L 33/38* | (2010.01) |
| *H01L 33/46* | (2010.01) |
| *H01L 33/60* | (2010.01) |
| *H01L 25/16* | (2006.01) |
| *H01L 33/20* | (2010.01) |

(52) U.S. Cl.
CPC ............ *H01L 25/167* (2013.01); *H01L 33/38* (2013.01); *H01L 33/46* (2013.01); *H01L 33/60* (2013.01); *G02F 2201/346* (2013.01); *H01L 33/20* (2013.01); *H01L 2933/0016* (2013.01)

(58) Field of Classification Search
CPC ....... H01L 25/167; H01L 33/38; H01L 33/46; H01L 33/60
See application file for complete search history.

(56) References Cited

U.S. PATENT DOCUMENTS

| | | | | |
|---|---|---|---|---|
| 5,661,091 | A * | 8/1997 | Duinkerken | H01L 21/78 438/424 |
| 6,528,779 | B1 * | 3/2003 | Franz | G01D 5/34715 250/214.1 |
| 6,958,498 | B2 * | 10/2005 | Shelton | H01L 33/38 257/79 |
| 8,624,287 | B2 * | 1/2014 | Lee | H01L 27/156 257/98 |
| 8,987,090 | B2 * | 3/2015 | Lemke | H01L 21/764 438/270 |
| 9,165,977 | B2 * | 10/2015 | Kim | H01L 27/156 |
| 9,171,950 | B2 * | 10/2015 | Wood | H01L 29/0865 |
| 9,343,620 | B2 * | 5/2016 | Chu | H01L 33/0079 |
| 9,570,596 | B2 * | 2/2017 | Gamerith | H01L 29/0619 |

(Continued)

FOREIGN PATENT DOCUMENTS

| | | | |
|---|---|---|---|
| CN | 203481235 U | * | 3/2014 |
| DE | 10 2015 107 577 | | 11/1916 |

(Continued)

*Primary Examiner* — Ida M Soward
(74) *Attorney, Agent, or Firm* — DLA Piper LLP (US)

(57) ABSTRACT

An optoelectronic semiconductor chip includes a semiconductor body including a first semiconductor region and a second semiconductor region, a recess extending through the first semiconductor region, the recess having a bottom surface, where the second semiconductor region is exposed, and a blocking element arranged on the bottom surface, wherein the at least one recess has a first width and a second width parallel to the main extension plane of the semiconductor body, and the first width is smaller than the second width.

16 Claims, 9 Drawing Sheets

(56) References Cited

U.S. PATENT DOCUMENTS

| | | | |
|---|---|---|---|
| 10,090,440 B1* | 10/2018 | Liu | H01L 33/38 |
| 10,388,690 B2* | 8/2019 | Jang | H01L 27/153 |
| 10,446,717 B2* | 10/2019 | Kopp | H01L 33/382 |
| 10,505,073 B2* | 12/2019 | Sung | H01L 25/0753 |
| 10,580,939 B2* | 3/2020 | Kim | H01L 33/387 |
| 10,651,344 B2* | 5/2020 | Chen | H01L 33/22 |
| 10,680,138 B2* | 6/2020 | Chen | H01L 33/46 |
| 2010/0230741 A1* | 9/2010 | Choi | H01L 21/76229 257/324 |
| 2014/0070291 A1* | 3/2014 | Song | H01L 27/10814 257/296 |
| 2014/0284710 A1* | 9/2014 | Hossain | H01L 29/36 257/330 |
| 2014/0361327 A1 | 12/2014 | Chae et al. | |
| 2015/0115396 A1* | 4/2015 | Lemke | H01L 21/76232 257/506 |
| 2015/0179736 A1* | 6/2015 | Lemke | H01L 29/0649 257/331 |
| 2015/0279978 A1* | 10/2015 | Meiser | H01L 29/808 257/586 |
| 2015/0311282 A1* | 10/2015 | Weber | H01L 29/7827 257/330 |
| 2016/0356453 A1* | 12/2016 | Ji | G02F 1/1335 |
| 2017/0040515 A1* | 2/2017 | Lee | H01L 33/62 |
| 2020/0287088 A1* | 9/2020 | Jeon | H01L 33/387 |

FOREIGN PATENT DOCUMENTS

| | | | |
|---|---|---|---|
| DE | 10 2016 112 587 | 1/1918 | |
| DE | 102014005770 A1 * | 12/2014 | H01L 21/26513 |

* cited by examiner

FIG 17A
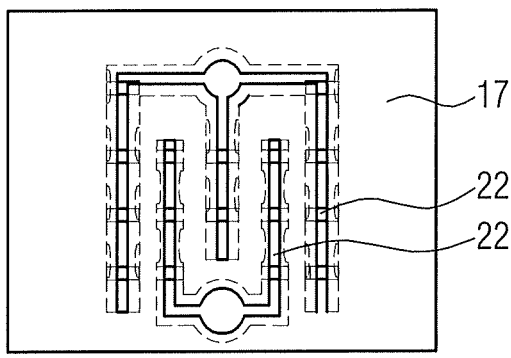
FIG 17B
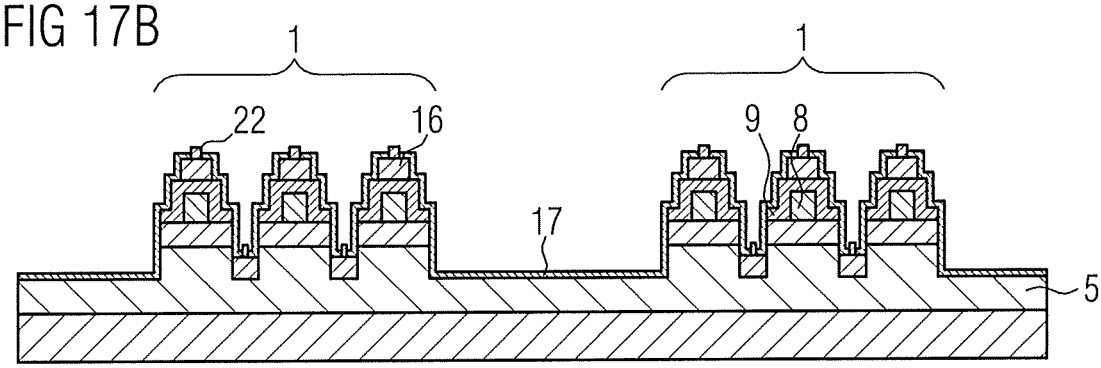
FIG 18A
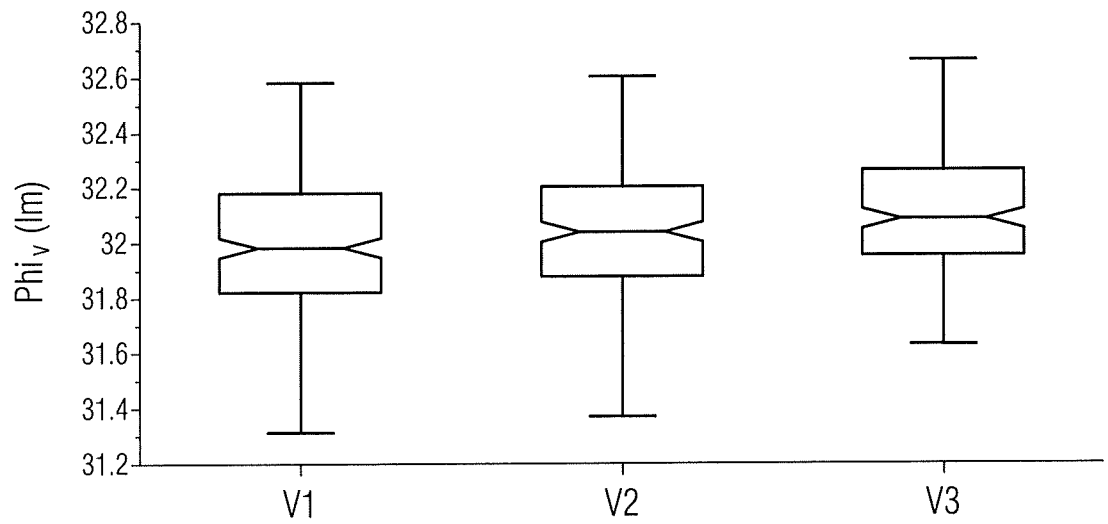
FIG 18B
|    | Phi$_V$ (lm) | ΔV1 (lm) | ΔV1 (%) |
|----|--------------|----------|---------|
| V1 | 31.99        |          |         |
| V2 | 32.04        | 0.05     | 0.16    |
| V3 | 32.09        | 0.10     | 0.32    |

OPTOELECTRONIC SEMICONDUCTOR CHIP AND METHOD OF PRODUCING AN OPTOELECTRONIC SEMICONDUCTOR CHIP

TECHNICAL FIELD

This disclosure relates to an optoelectronic semiconductor chip and a method of producing an optoelectronic semiconductor chip.

BACKGROUND

There is a need to provide an optoelectronic semiconductor chip with improved efficiency and a method of producing such an optoelectronic semiconductor chip.

SUMMARY

We provide an optoelectronic semiconductor chip including a semiconductor body comprising a first semiconductor region and a second semiconductor region, a recess extending through the first semiconductor region, the recess having a bottom surface, where the second semiconductor region is exposed, and a blocking element arranged on the bottom surface, wherein the at least one recess has a first width and a second width parallel to the main extension plane of the semiconductor body, and the first width is smaller than the second width.

We also provide a method of producing a plurality of optoelectronic semiconductor chips including providing a semiconductor wafer comprising a plurality of the semiconductor bodies, applying a first structured sacrificial layer on the semiconductor wafer by a first mask, wherein the first mask has a plurality of contiguous first blinds, and the first blinds each have a first width and a second width in the main extension plane, producing a plurality of the recesses in the semiconductor wafer below the first blinds, applying a further structured sacrificial layer by a further first mask, wherein the further first mask shows a plurality of further first blinds, applying a plurality of the blocking elements below the further first blinds, and producing a plurality of the optoelectronic semiconductor chips by separation.

BRIEF DESCRIPTION OF THE DRAWINGS

FIGS. 2A, 2B, 3A, 3B, 4A, 4B, 5A, 5B, 6A, 6B, 7A, 7B, 8A, 8B, 9A, 9B, 10A, 10B, 11A, 11B, 12A, 12B, 13A, 13B, 14A, 14B, 15A, 15B, 16A, 16B and 17A and 17B are schematic sectional views of process steps of examples of our optoelectronic semiconductor chips.

FIGS. 18A and 18B show measured values of examples of an optoelectronic semiconductor chip.

Figure 1A:
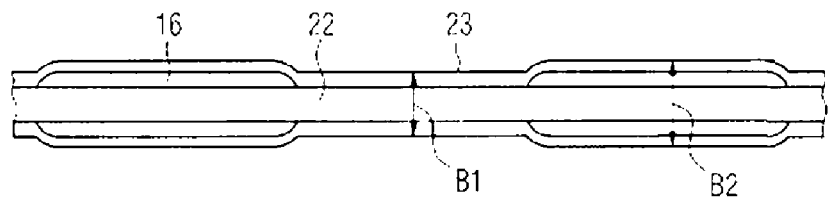
FIGS. 1A and 1B are schematic sectional views in plan view of a mask for examples of our methods.

REFERENCE SIGNS 1 optoelectronic semiconductor chip
2 semiconductor wafer
3 carrier
4 first semiconductor region
5 second semiconductor region
6 second sacrificial layer
7 second openings
8 Bragg mirror layer
9 current spreading layer
10 first sacrificial layer
11 first openings
12 recesses
13 further first sacrificial layer
14 further first openings
15 blocking layer
16 blocking elements
17 passivation layer
18 third sacrificial layer
19 third openings
20 further recesses
21 metallic connection layer
22 metallic connecting contact
23 blind
24 active region
25 semiconductor body
B1 first width
B2 second width

DETAILED DESCRIPTION

We provide an optoelectronic semiconductor chip. For example, the optoelectronic semiconductor chip emits electromagnetic radiation, in particular visible light during operation. The optoelectronic semiconductor chip is, for example, a light emitting diode chip, LED chip for short, or a laser diode chip.

The optoelectronic semiconductor chip may comprise a semiconductor body comprising a first semiconductor region and a second semiconductor region. The semiconductor body, for example, is an epitaxially grown semiconductor body. The semiconductor body may be based on a III-V compound material. For example, the semiconductor body may comprise an active region formed to generate electromagnetic radiation.

For example, the semiconductor body comprises the first semiconductor region of a first conductivity type and the second semiconductor region of a second, different conductivity type. For example, the first semiconductor region is n-doped and thus n-conductive and the second semiconductor region is p-doped and thus p-conductive.

For example, the active region is arranged between the first semiconductor region and the second semiconductor region. For example, the active region adjoins directly to the two semiconductor regions. The semiconductor body, in particular the two semiconductor regions and the active region between them, has a main extension plane. The semiconductor body has a growth direction transverse or perpendicular to the main extension plane.

The optoelectronic semiconductor chip may comprise a recess extending through the first semiconductor region. In addition, the recess has a bottom surface, where the second semiconductor region is exposed. This is to say that the recess completely penetrates the first semiconductor region. The first semiconductor region is therefore completely removed in the area of the recess and penetrated by the recess. The bottom surface is formed by a part of the second semiconductor region. Furthermore, the recess completely penetrates the active region.

For example, the recess only partially penetrates the second semiconductor region. This is to say that in the area of the recess, the second semiconductor region is only removed to a certain depth. For example, it is possible that the recess does not completely penetrate the second semiconductor region at any place. The second semiconductor region is then only partially removed and is not completely penetrated by the recess.

Further, the optoelectronic semiconductor chip may have a plurality of recesses extending through the first semiconductor region and each having a bottom surface where the second semiconductor region is exposed.

The optoelectronic semiconductor chip may comprise a blocking element arranged on the bottom surface. For example, the blocking element is electrically insulating and formed to block a current flow. The blocking element may contain or consist of an insulating oxide, nitride or oxynitride. Furthermore, the blocking element can, for example, be in direct and immediate contact with the bottom surface and thus with the second semiconductor region.

Furthermore, it is possible that a plurality of the blocking elements are arranged on the bottom surface of the recess. These can then, for example, be arranged in a plane along lines or matrix-like, i.e., arranged along rows and columns. This is to say that the blocking elements can, for example, be arranged at grid points of a regular grid. In addition, the blocking elements can be arranged along curved curves.

The at least one recess may have a first width and a second width parallel to the main extension plane of the semiconductor body. The first width is different from the second width. The first width and the second width each correspond to a smallest extension of a cross-sectional area of the recess parallel to the main extension plane at a level of the active region. This is to say that the first width and the second width are the distance between, for example, two opposite inner sides of the recess, parallel to the main plane of the semiconductor body. For example, the distance is defined at the level of a top surface of the active region.

For example, the first width of the recess is substantially the same within the scope of production tolerance. In addition, for example, the second width of the recess is substantially the same within the scope of production tolerance. Substantially the same means that small irregularities due to production tolerances can lead, for example, to a variation of the widths. For example, the recess may have a first length in the area of the first width and the recess may have a second length in the area of the second width. For example, it is possible that both lengths are of equal length. It is also possible that the lengths are different and the first length is smaller than the second length, or the first length is larger than the second length.

Further, the recess may have a plurality of first widths and a plurality of second widths. The first widths of the recess and the second widths of the recess can, for example, be arranged along lines or matrix-like, i.e., arranged along rows and columns, in a plane. For example, the first and second widths of the recess can be arranged, for example, at grid points of a regular grid. In addition, areas of different widths can be arranged along curved curves.

The first width may be smaller than the second width. This is to say that a distance between the two opposite inner sides of the recess in the area of the first width may be smaller than a distance between the two opposite inner sides of the recess of the second width, parallel to the main extension plane of the semiconductor body at the level of the active region. For example, the recess in the area of the second width is at least 1.1 or 2 times larger than the recess in the area of the first width. Since the recess completely penetrates the active region, it is removed in the area of the recess. This is to say that in the area of the first width, less of the active region is advantageously removed than in the area of the second width.

The optoelectronic semiconductor chip may comprise a semiconductor body comprising a first semiconductor region and a second semiconductor region, a recess extending through the first semiconductor region. The recess has a bottom surface where the second semiconductor region is exposed and a blocking element is arranged on the bottom surface. The at least one recess parallel to the main extension plane of the semiconductor body has a first width and a second width and the first width is smaller than the second width.

The optoelectronic semiconductor chip makes use, among other things, of the idea that less material is removed from the active region in the area of a smaller width. This is to say that the resulting increased area of the active region has a beneficial effect on the light extraction and efficiency of the optoelectronic semiconductor chip, as more active region is available for light generation.

For example, it is possible to arrange blocking elements below metallic connecting contacts to prevent a direct current flow into the semiconductor body. The blocking elements are formed wider than the connecting contacts. For example, to energize an n-doped semiconductor layer of the semiconductor body, it is possible to create a recess through the active region using a mask of constant width. The width of the removed active region corresponds to the width of the blocking element.

One idea of the optoelectronic semiconductor chip is to use a mask with two different widths. One width corresponds to the width of the blocking element, while the other width is smaller. This is to say that less of the active region is removed, resulting in an improved efficiency. Such an enlarged active region, for example, increases the light extraction.

The blocking element may be arranged on the bottom surface, where the recess has the second width. For example, the blocking element partially fills the recess with the second width. For example, a top surface of the blocking element does not project beyond the active region in the growth direction, i.e., in the direction from the second semiconductor region to the first semiconductor region. For example, the blocking element is in direct and immediate contact with the two opposite inner sides of the recess. For example, the recess in the area of the first width has no blocking element and the bottom area of the recess in the area of the first width is free of the blocking element.

If the recess has several first and second widths, the blocking elements are also arranged on the bottom surface where the recesses have the second widths.

To energize the second semiconductor region, for example, an electrically conductive connecting contact is arranged on the bottom surface, where the recess has the first width. In addition, the connecting contact is arranged, for example, on the blocking element. In this example, the connection contact is formed in a continuous manner. The connecting contact, for example, is in direct and immediate contact with the second semiconductor region where the recess has the first width. For example, the connecting contact is interrupted in places by the blocking element where the recess has the second width. The electrically conductive connecting contact, for example, has a smaller width than the blocking element. The blocking element, for example, prevents a direct current flow into the second semiconductor region and thus prevents an accumulation of charge carriers, in particular electrons, below the connecting contact.

A Bragg mirror layer may be arranged on the first semiconductor region in places. The Bragg mirror layer, for example, comprises alternately arranged layers of a high-refractive and a low-refractive material. The Bragg mirror layer, for example, is then formed electrically insulating.

The Bragg mirror layer preferably has a reflectivity of at least 90% for the electromagnetic radiation generated in the active region.

The Bragg mirror layer may have a first width and a second width parallel to the main extension plane, and the first width is smaller than the second width. The first width of the Bragg mirror layer and the second width of the Bragg mirror layer each correspond to a smallest extension of an area parallel to the main extension plane on a top surface of the first semiconductor region. This is to say that the first width of the Bragg mirror layer and the second width of the Bragg mirror layer is the distance between, for example, two opposite inner sides of the Bragg mirror layer parallel to the main extension plane of the semiconductor body. For example, the distance is defined on the top surface of the first semiconductor region. For example, the second width of the Bragg mirror layer is at least 1.1 or 2 times greater than the first width of the Bragg mirror layer.

A side surface and a top surface of the Bragg mirror layer and a top surface of the first semiconductor region may be completely covered by a current spreading layer. For example, the current spreading layer is formed transparent to the electromagnetic radiation generated during operation of the optoelectronic semiconductor chip. In addition, the current spreading layer is made of a transparent, electrically conductive material. The current spreading layer, for example, has transparent conductive oxides. The mirror layer completely covers the top surface of the first semiconductor region, which is not covered by the Bragg mirror layer, for example. For example, a side surface of the current spreading layer terminates flush with a side surface of the first semiconductor region. The current spreading layer, for example, is in direct and immediate contact with the first semiconductor region.

In addition, the current spreading layer completely covers an outer surface of the Bragg mirror layer not covered by the top surface of the first semiconductor region, for example. The current spreading layer, for example, is in direct and immediate contact with the Bragg mirror layer.

Advantageously, due to the different widths of the Bragg mirror layer, a larger area of the first semiconductor region is covered by the current spreading layer. This is to say that the Bragg mirror layer in the first width area covers less area of the first semiconductor region than the Bragg mirror layer in the second width area. This is to say that a contact surface of the current spreading layer and the first semiconductor region is enlarged. The enlarged contact surface, for example, increases the light extraction.

A further blocking element may be arranged on the current spreading layer in places. The further blocking element, for example, is electrically insulating. The further blocking element may contain or consist of an insulating oxide, nitride or oxynitride. Furthermore, the further blocking element can be in direct and immediate contact with a top surface of the current spreading layer, for example.

It is also possible that a plurality of the further blocking elements are arranged on the top surface of the current spreading layer. These can then, for example, be arranged along lines or matrix-like, i.e., arranged along rows and columns, in a plane. This is to say that the further blocking elements can, for example, be arranged at grid points of a regular grid. In addition, the further blocking elements can be arranged along curved curves. The further blocking elements, for example, prevent a direct current flow into the first semiconductor region.

The further blocking element may be arranged over a region of the Bragg mirror layer with the second width. For example, a cross-sectional area parallel to the main extension plane of the further blocking element is smaller than the cross-sectional area parallel to the main extension plane of the Bragg mirror layer in the area of the second width. For example, the cross-sectional area of the blocking element completely overlaps with the cross-sectional area of the Bragg mirror layer in the growth direction. For example, no further blocking element is arranged above the Bragg mirror layer in the area of the first width, and the top surface of the current spreading layer above the Bragg mirror layer in the area of the first width is free of the blocking element.

If the Bragg mirror layer has several first and second widths, the further blocking elements are also arranged on the top surface of the current spreading layer where the Bragg mirror layer has the second widths.

In addition, we provide a method of producing an optoelectronic semiconductor chip. The method is suitable for producing our optoelectronic semiconductor chips. This is to say that our optoelectronic semiconductor chips can be produced with the method. All features disclosed in connection with the optoelectronic semiconductor chip are therefore also disclosed in connection with the method and vice versa.

The method may comprise the step of providing a semiconductor wafer comprising a plurality of the semiconductor bodies. The semiconductor wafer, for example, is an epitaxially grown semiconductor wafer. The semiconductor wafer may also comprise a carrier in addition to the semiconductor body comprising the first and second semiconductor regions. The carrier, for example, represents the mechanically supporting component of the semiconductor wafer.

The method may comprise the step of applying a first structured sacrificial layer on the semiconductor wafer by means of a first mask. The sacrificial layer is produced, for example, by sputtering or vapor deposition on the top side of the semiconductor wafer.

The first mask may have a plurality of contiguous first blinds, and the first blinds each have a first width and a second width in the main extension plane. The blinds, for example, prevent the sacrificial layer from being applied to the semiconductor wafer. For example, the first width of the first blinds is different from the second width of the first blinds. The first width and the second width of the first blinds each correspond to a smallest extension of an area parallel to the main extension plane at the level of a top surface of the first mask. This is to say that the first width and the second width of the first blinds is the distance between, for example, two opposite inner sides of the blinds, parallel to the main extension plane of the semiconductor body.

It is possible that the first width of the first blinds is smaller than the second width of the first blinds. This is to say that a distance between the two opposite inner sides of the first blinds in the area of the first width is smaller than a distance between the two opposite inner sides of the first blinds in in the area of the second width, parallel to the main extension plane of the semiconductor body at the level of the top surface of the first mask.

For example, the first and second widths of the first blinds may be slightly smaller than the first and second widths of the recess.

For example, the first width of the first blinds is substantially the same within the scope of production tolerance. In addition, for example, the second width of the first blinds is substantially the same within the scope of production tolerance. Substantially the same means that small irregularities due to production tolerances, for example, can lead to a variation in the widths of the first blinds. For example, the first blinds may have a first length of the first blinds in the area of the first width, and the first blinds may have a second length of the first blinds in the area of the second width. For example, it is possible that the two lengths of the first blinds are the same. It is also possible that the lengths of the first blinds differ and the first length of the first blinds is less than the second length of the first blinds, or the first length of the first blinds is greater than the second length of the first blinds. Furthermore, for example, the first and second lengths of the first blinds may be slightly shorter than the first and second lengths of the recesses.

This is to say that the semiconductor wafer is not covered with the first structured sacrificial layer below the first blinds. A plurality of the first openings in the sacrificial layer, for example, then has the shape of the blinds.

The method may comprise the step of producing a plurality of the recesses in the semiconductor wafer below the first blinds. The material removal of the recesses can, for example, be produced by etching. The semiconductor wafer covered by the first structured sacrificial layer, for example, is not removed by etching.

The method may comprise the step of applying a further structured sacrificial layer by a further first mask. The further sacrificial layer is produced, for example, by sputtering or vapor deposition at the top surface of the semiconductor wafer.

The further first mask may show a plurality of further first blinds. The further first blinds may, for example, have a rectangular, a round or an oval shape. The further first blinds can then be arranged along lines or matrix-like, i.e., arranged along rows and columns, in a plane. This is to say that the further first blinds can, for example, be arranged at grid points of a regular grid. In addition, the further first blinds can be arranged along curved curves.

The semiconductor wafer, for example, is not covered with the further first structured sacrificial layer below the further first blinds. A plurality of the further first openings in the sacrificial layer, for example, has the described form of the further first blinds.

The method may comprise the step of applying a plurality of the blocking elements below the further first blinds. The blocking elements can, for example, be applied by sputtering or evaporation. For example, a blocking layer is applied over the semiconductor wafer. The blocking layer covers the semiconductor wafer and all applied components on a side facing away from the semiconductor wafer. For example, in addition to the semiconductor wafer, the further sacrificial layer is also covered by the blocking layer. The further sacrificial layer and the blocking layer applied to the further sacrificial layer can then be removed by etching, for example. The blocking layer below the further first blinds is not removed by the etching process. This is to say that the blocking layer only remains in places on the semiconductor wafer and forms the blocking elements.

The method may comprise the step of separating into a plurality of optoelectronic semiconductor chips. For example, the semiconductor wafer is separated into optoelectronic semiconductor chips by cuts parallel to the growth direction through the semiconductor wafer.

The method may comprise the step of applying a second structured sacrificial layer on the semiconductor wafer by a second mask prior to application of the structured sacrificial layer.

The second mask may have a plurality of contiguous second blinds, wherein the second blinds have a first width and a second width in the main extension plane, and wherein the Bragg mirror layer is applied below the further second blinds.

In the following, the optoelectronic semiconductor chip and the method of producing an optoelectronic semiconductor chip are explained in more detail with reference to the figures on the basis of examples.

Same, similar or similar acting elements are provided in the Figures with the same reference signs. The Figures and the proportions of the elements shown in the Figures are not to be regarded as true to scale. Rather, individual elements and in particular layer thicknesses may be exaggeratedly large for better representability and/or better understanding.

Figure 1B:
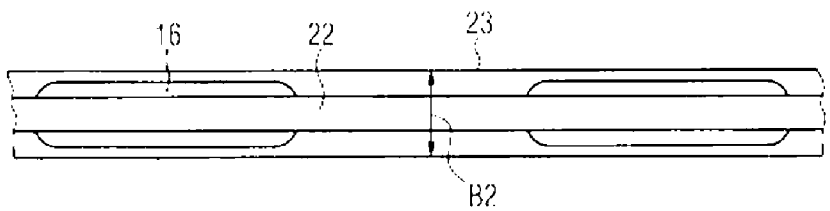

In connection with FIGS. 1A and 1B, an example of a mask is shown.

According to FIG. 1A, the mask has a blind 23 comprising a first width B1 and a second width B2. Where the blind 23 has the second width B2, a blocking element 16 is arranged. Above the blocking element 16 there is a metallic connecting contact 22. An active region is only removed below the blind shape.

According to FIG. 1B, the mask has a blind 23 comprising only the second width B2. This is to say that with such a mask shape, the active region is continuously removed with a width of B2.

In connection with FIGS. 2A and 2B to 17A and 17B, an example of our method of producing an optoelectronic semiconductor chips 1 is shown in a schematic cross-sectional view. In connection with the FIGS. 2A to 17A a plan view of the respective process step is shown and with the FIGS. 2B to 17B a sectional view is shown.

Figure 2A:
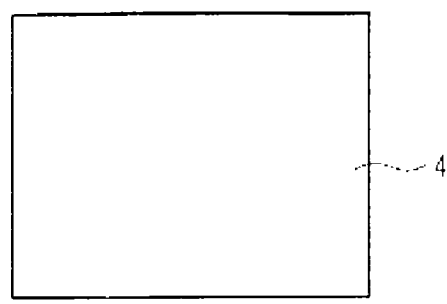
Figure 2B:
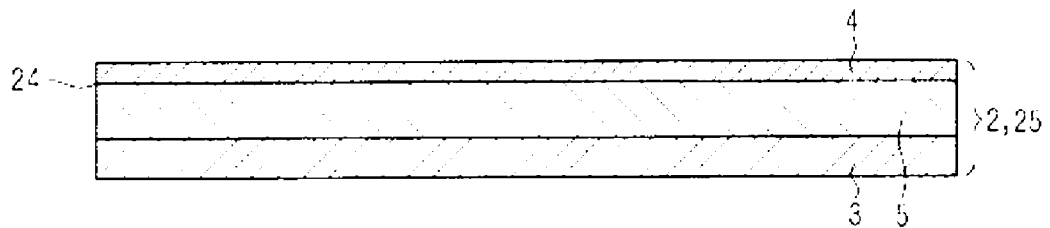

According to FIGS. 2A and 2B, a semiconductor wafer 2 comprising an active region 24 arranged between a first semiconductor region 4 and a second semiconductor region 5 is provided in a first method step. For example, the first semiconductor region 4 is p-doped and the second semiconductor region 5 is n-doped. The first semiconductor region 4 is arranged here on the second semiconductor region 5. In addition, the two semiconductor regions 4 and 5 can, for example, be arranged on a carrier 3.

Figure 3A:
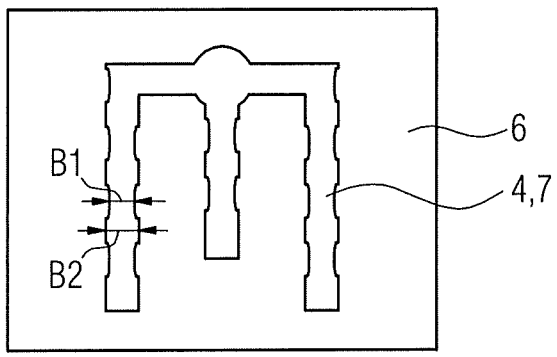
Figure 3B:
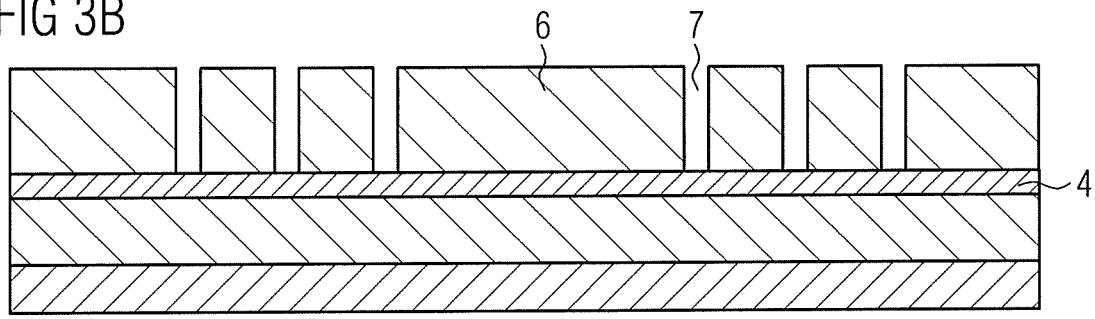

According to FIGS. 3A and 3B, in a next method step, a second sacrificial layer 6 is applied to the semiconductor wafer by a second mask. The second sacrificial layer 6 has second openings 7 with a width of B1 and B2.

Figure 4A:
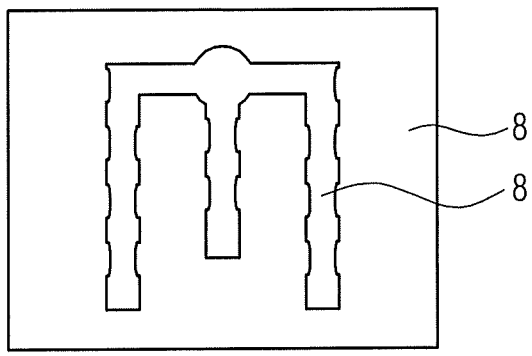
Figure 4B:
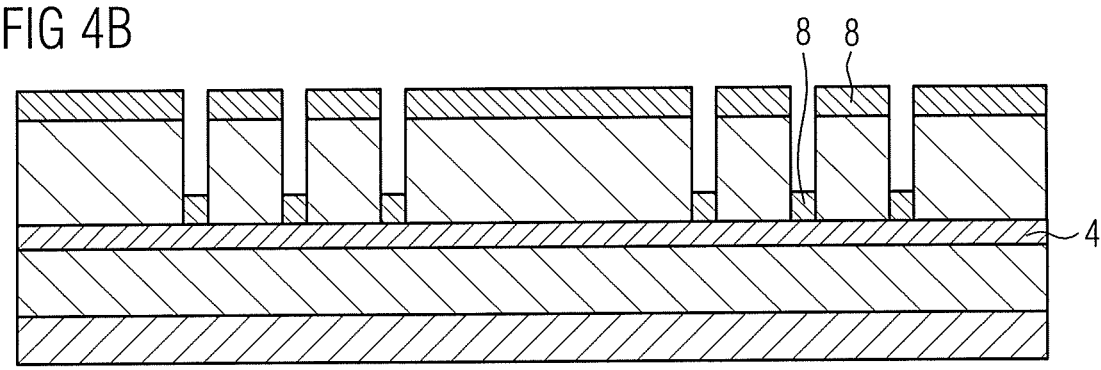

According to FIGS. 4A and 4B, in a next method step, a Bragg mirror layer 8 is applied to the second sacrificial layer 6 and the exposed first semiconductor region 1.

Figure 5A:
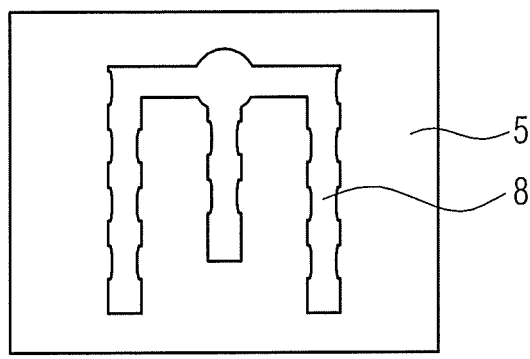
Figure 5B:
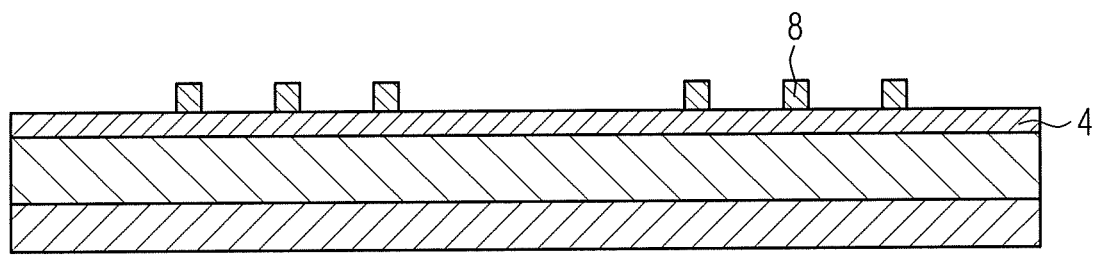

According to FIGS. 5A and 5B, in a next method step, the second sacrificial layer 6 is removed by, for example, chemical etching.

Figure 6A:
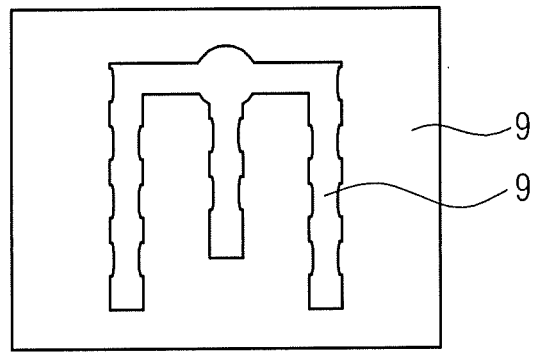
Figure 6B:
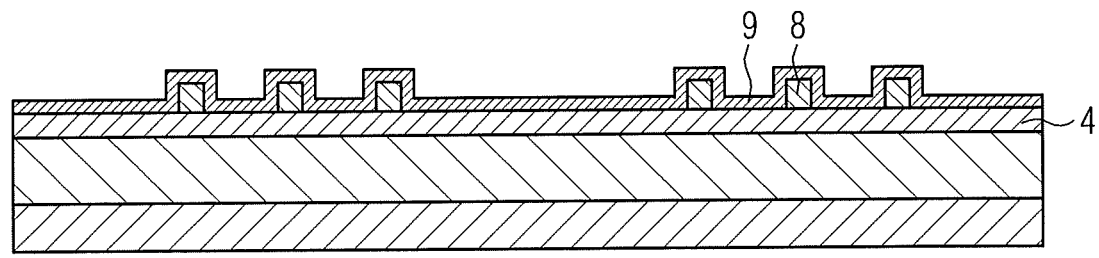

According to FIGS. 6A and 6B, in a next method step, a current spreading layer 9 is applied over the semiconductor wafer 2.

Figure 7A:
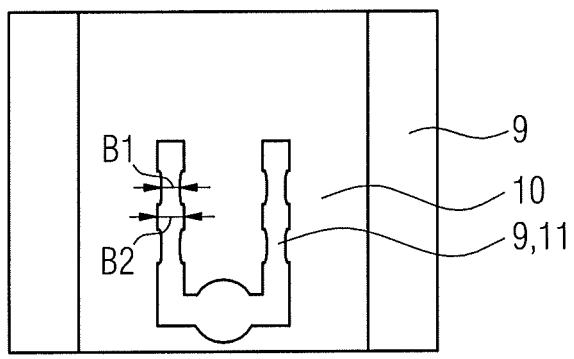
Figure 7B:
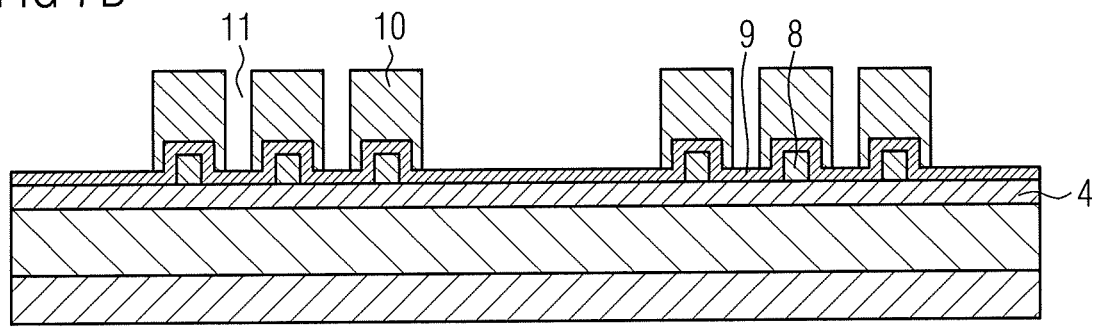

According to FIGS. 7A and 7B, in a next method step, a first structured sacrificial layer 10 is applied over the semiconductor wafer 2 by a first mask. The first sacrificial layer 10 has the first openings 11, which have different widths B1 and B2. The second width B2 is larger than the first width B1.

Figure 8A:
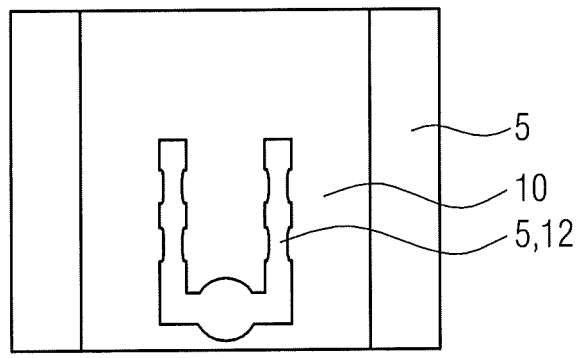
Figure 8B:
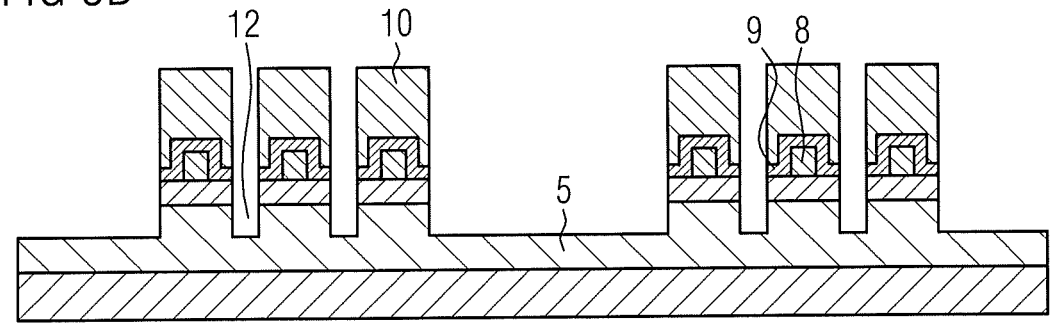

According to FIGS. 8A and 8B, in a next method step, a plurality of recesses 12 are produced in the semiconductor wafer. The areas below the first sacrificial layer 10 are not removed. The material removal, for example, is produced by chemical etching.

Figure 9A:
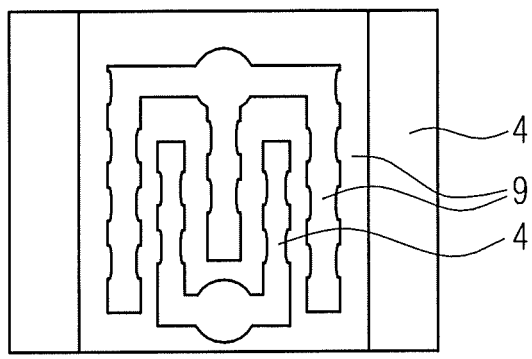
Figure 9B:
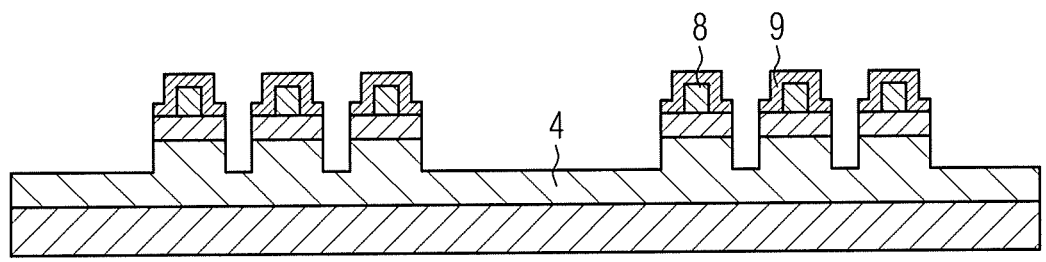

According to FIGS. 9A and 9B, in a next method step, the first sacrificial layer 10 is removed.

Figure 10A:
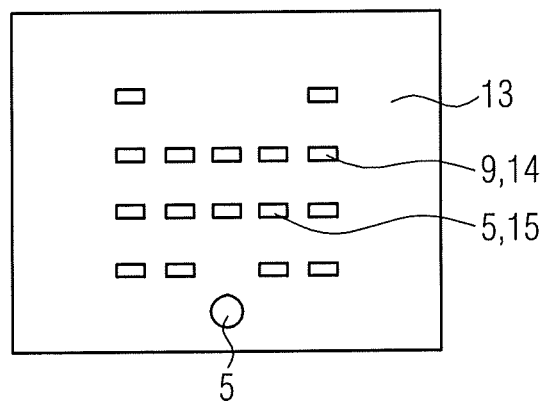
Figure 10B:
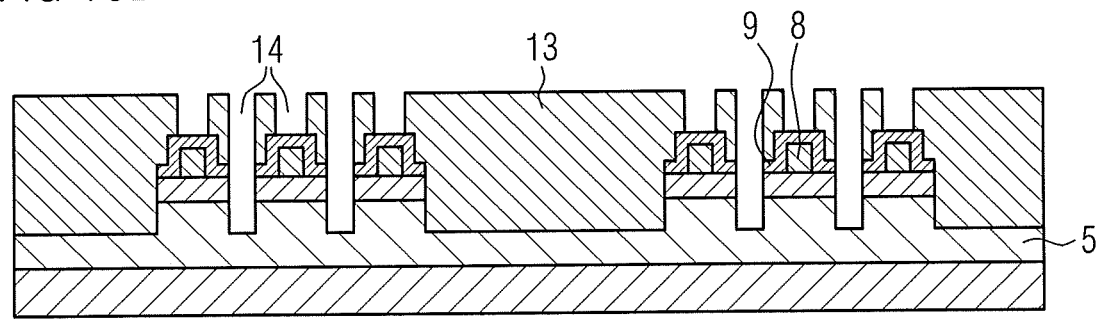

According to FIGS. 10A and 10B, a further first structured sacrificial layer 13 is applied in a next method step. The further first structured sacrificial layer 13 has further first openings 14 having a rectangular form.

Figure 11A:
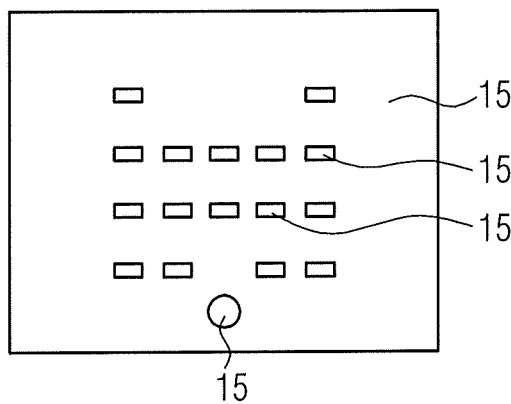
Figure 11B:
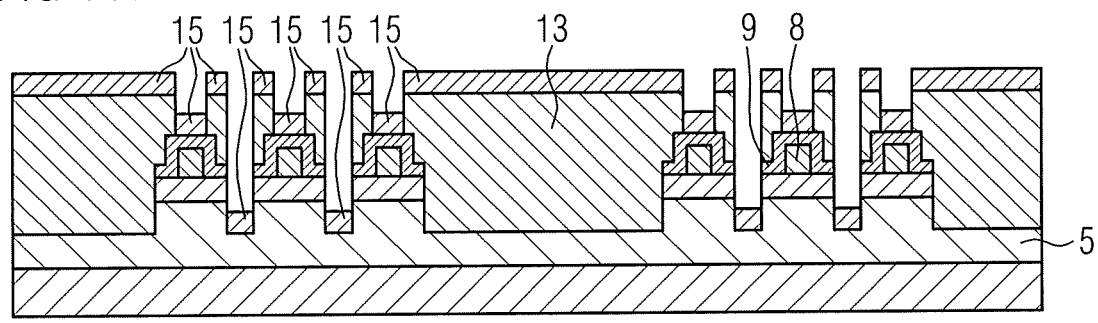

According to FIGS. 11A and 11B, a blocking layer 15 is applied over the semiconductor wafer 2 in a next method step.

Figure 12A:
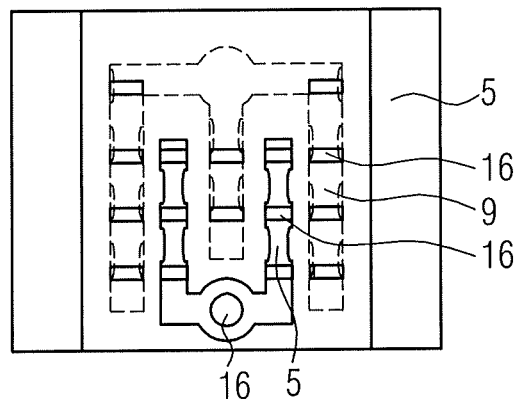
Figure 12B:
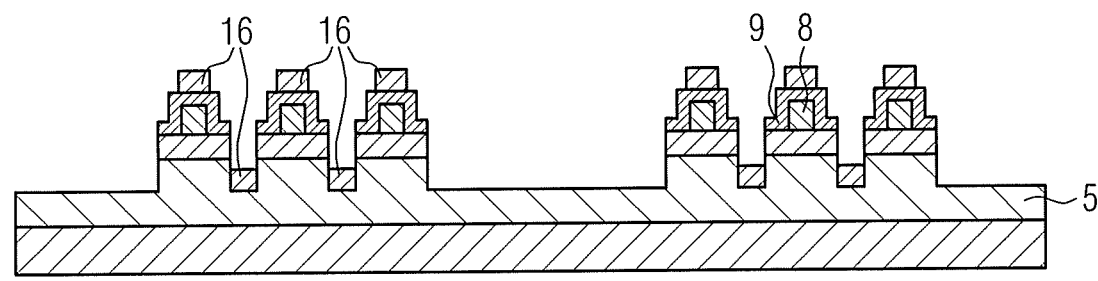

According to FIGS. 12A and 12B, in a next method step, the further first sacrificial layer 13 is removed and blocking elements 16 remain.

Figure 13A:
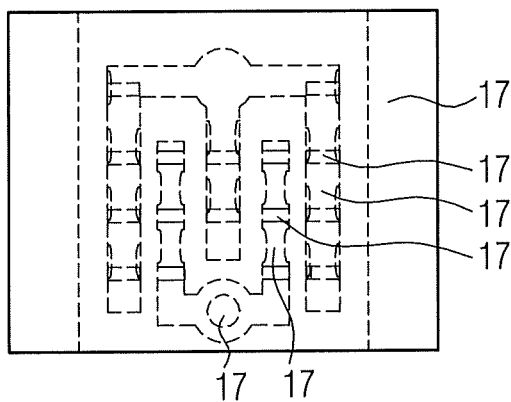
Figure 13B:
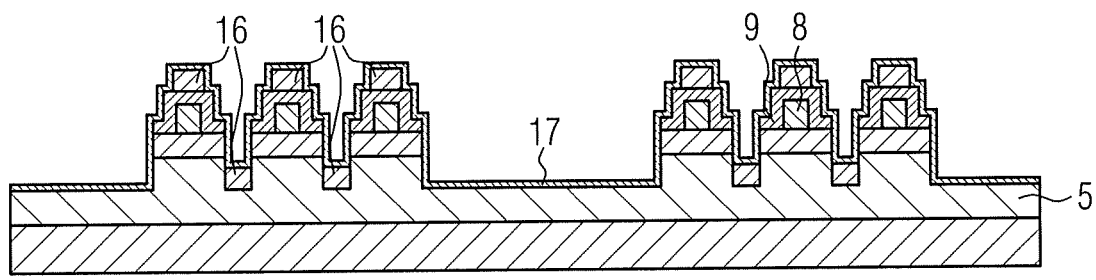

According to FIGS. 13A and 13B, in a next method step, a passivation layer 17 is applied over the semiconductor wafer 2.

Figure 14A:
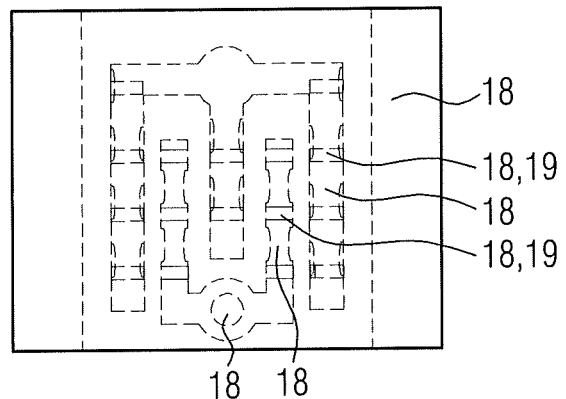
Figure 14B:
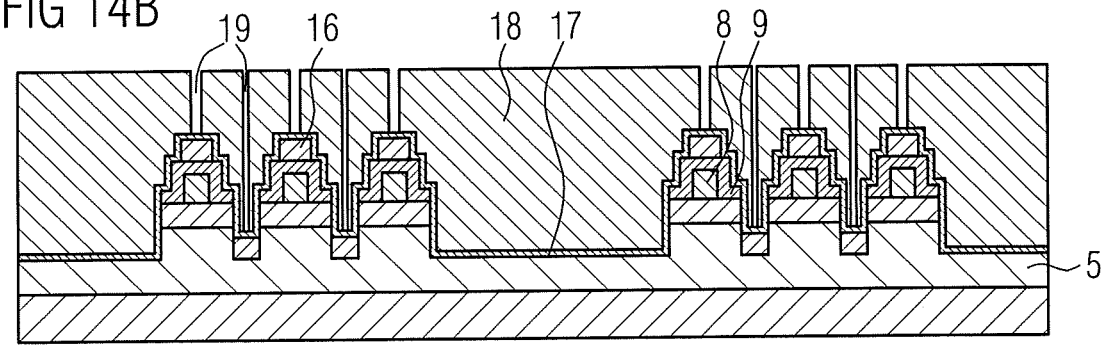

According to FIGS. 14A and 14B, in a next method step, a third structured sacrificial layer 18 is applied over the semiconductor wafer 2 having third openings 19.

Figure 15A:
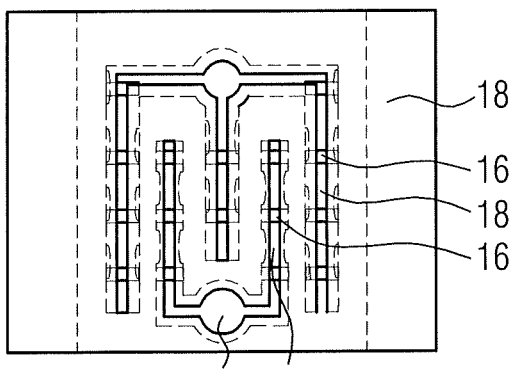
Figure 15B:
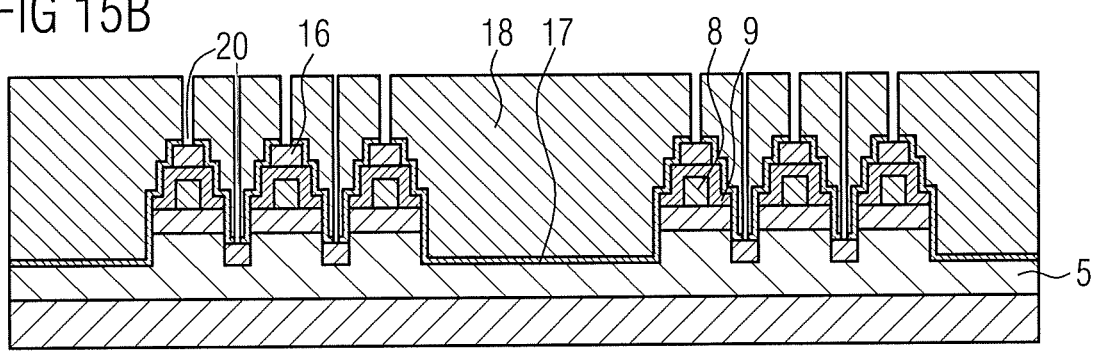

According to FIGS. 15A and 15B, in a next method step, additional further recesses 20 are produced in the third openings 19 in the passivation layer 17. The further recesses 20 completely penetrate the passivation layer 17.

Figure 16A:
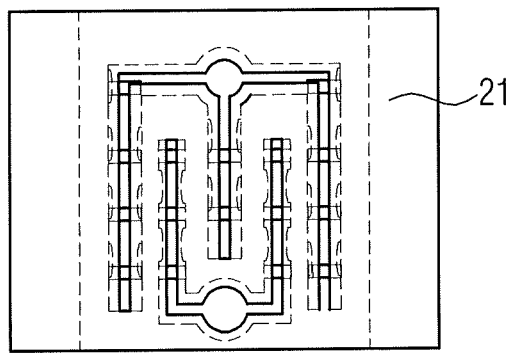
Figure 16B:
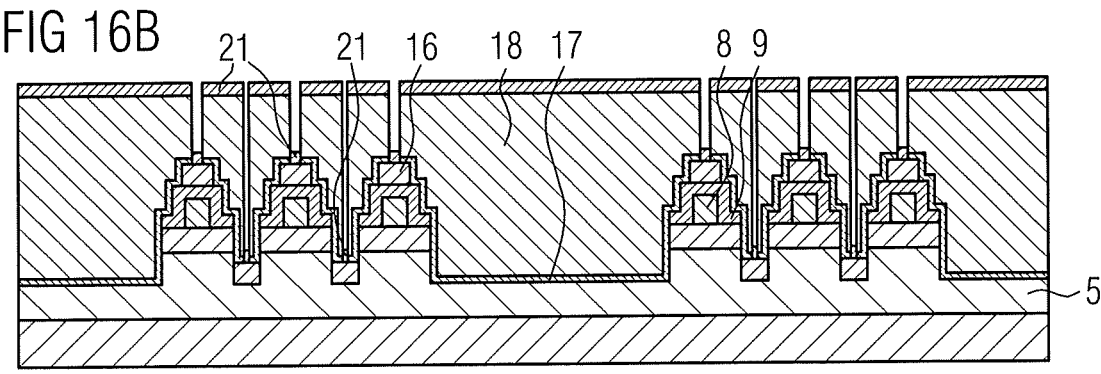

According to FIGS. 16A and 16B, in a next method step, a metallic connection layer 21 is applied over the semiconductor wafer 2.

According to FIGS. 17A and 17B, in a next method step, the third sacrificial layer 18 is removed and blocking elements 16 remain.

FIG. 18A shows a diagram of luminous flux $Phi_v$ in Lumen (lm) for various examples of an optoelectronic semiconductor chip 1. V1 denotes an optoelectronic semiconductor chip 1 produced by the mask shape described in FIG. 1B. This is to say that the active region is continuously removed with a width of B2. V2 denotes an optoelectronic semiconductor chip 1, which is also produced with the mask shape described in FIG. 1B. In addition, blocking elements 16 are applied in places between the metallic connecting contacts 22 and the first and second semiconductor regions 4 and 5. V3 denotes an optoelectronic semiconductor chip 1 produced by the mask shape described in FIG. 1A, wherein the mask comprises the first width B1 and the second width B2. In addition, the optoelectronic semiconductor chip V3 comprises blocking elements.

FIG. 18B shows a table showing the luminous flux $Phi_v$ in Lumen (lm) for the various examples of an optoelectronic semiconductor chip 1 according to FIG. 18A. In addition, the absolute deviations $\Delta V1$ (lm) and the relative deviations $\Delta V1(\%)$ of the luminous flux $Phi_v$ of the optoelectronic semiconductor chip V1 to the examples of the optoelectronic semiconductor chips V2 and V3 are shown. The optoelectronic semiconductor chip V3 shows an increased luminous flux $Phi_v$.

Priority of DE 102018101393.0 is claimed, whose subject matter is expressly incorporated herein by reference.

Our chips and methods are not limited by the description on the basis of the examples. Rather, this disclosure includes each new feature and each combination of features, which includes in particular each combination of features in the appended claims, even if the feature or combination itself is not explicitly indicated in the claims or examples.

What is claimed is:

1. An optoelectronic semiconductor chip comprising:
   a semiconductor body comprising a first semiconductor region and a second semiconductor region,
   an active region formed to generate electromagnetic radiation,
   a recess extending through the first semiconductor region, the recess having a bottom surface, where the second semiconductor region is exposed, and
   a blocking element arranged on the bottom surface, wherein
   the active region is arranged between the first semiconductor region and the second semiconductor region,
   the recess has a plurality of first widths and a plurality of second widths parallel to a main extension plane of the semiconductor body,
   the first widths of the recess and the second widths of the recess are arranged alternating along at least one line, and
   the first width is smaller than the second width.

2. The optoelectronic semiconductor chip according to claim 1, wherein the blocking element is arranged on the bottom surface where the recess has the second width.

3. The optoelectronic semiconductor chip according to claim 1, wherein a Bragg mirror layer is arranged on the first semiconductor region in places.

4. The optoelectronic semiconductor chip according to claim 3, wherein the Bragg mirror layer has a first width and a second width parallel to the main extension plane, and the first width is smaller than the second width.

5. The optoelectronic semiconductor chip according to claim 3, wherein a side surface and a top surface of the Bragg mirror layer and a top surface of the first semiconductor region are completely covered by a current spreading layer.

6. The optoelectronic semiconductor chip according to claim 5, wherein a further blocking element is arranged on the current spreading layer in places.

7. The optoelectronic semiconductor chip according to claim 6, wherein the further blocking element is arranged over a region of a Bragg mirror layer with the second width.

8. The optoelectronic semiconductor chip according to claim 1, further comprising a plurality of second widths arranged at grid points of a regular grid.

9. The optoelectronic semiconductor chip according to claim 2, wherein the second width corresponds to the width of the blocking element.

10. The optoelectronic semiconductor chip according to claim 2, further comprising a metallic connecting contact, wherein the blocking element is arranged below the metallic connecting contact.

11. The optoelectronic semiconductor chip according to claim 10, wherein the metallic connecting contact has a smaller width than the blocking element.

12. A method of producing a plurality of optoelectronic semiconductor chips according to claim 1, comprising:
   providing a semiconductor wafer comprising a plurality of the semiconductor bodies,
   applying a first structured sacrificial layer on the semiconductor wafer by a first mask, wherein
   the first mask has a plurality of contiguous first blinds, and the first blinds each have a first width and a second width in the main extension plane,
   producing a plurality of the recesses in the semiconductor wafer below the first blinds,
   applying a further structured sacrificial layer by a further first mask, wherein the further first mask shows a plurality of further first blinds,
   applying a plurality of the blocking elements below the further first blinds, and
   producing a plurality of the optoelectronic semiconductor chips by separation.

13. The method according to claim 12, wherein, prior to application of the structured sacrificial layer, a second structured sacrificial layer is applied to the semiconductor wafer by a second mask.

14. The method according to claim 12, wherein
- the second mask has a plurality of contiguous second blinds,
- the second blinds have a first width and a second width in the main extension plane, and
- a Bragg mirror layer is applied below the further second blinds.

15. An optoelectronic semiconductor chip comprising:
- a semiconductor body comprising a first semiconductor region and a second semiconductor region,
- a recess extending through the first semiconductor region, the recess having a bottom surface, where the second semiconductor region is exposed, and
- a blocking element arranged on the bottom surface, wherein
- a Bragg mirror layer is arranged on the first semiconductor region in places,
- a side surface and a top surface of the Bragg mirror layer and a top surface of the first semiconductor region are completely covered by a current spreading layer,
- the recess has a first width and a second width parallel to the main extension plane of the semiconductor body, and
- the first width is smaller than the second width.

16. An optoelectronic semiconductor chip comprising:
- a semiconductor body comprising a first semiconductor region and a second semiconductor region,
- a recess extending through the first semiconductor region, the recess having a bottom surface, where the second semiconductor region is exposed, and
- a blocking element arranged on the bottom surface, wherein
- the recess has a first width and a second width parallel to the main extension plane of the semiconductor body,
- the second width corresponds to the width of the blocking element, and
- the first width is smaller than the second width.

* * * * *